United States Patent [19]

Kern

[11] Patent Number: 4,939,411

[45] Date of Patent: Jul. 3, 1990

[54] COMPOSITE VACUUM EVAPORATION COIL

[75] Inventor: Edmund R. Kern, Auburn, Me.

[73] Assignee: North American Philips Corporation, New York, N.Y.

[21] Appl. No.: 169,152

[22] Filed: Mar. 8, 1988

Related U.S. Application Data

[63] Continuation of Ser. No. 932,256, Nov. 19, 1986, abandoned.

[51] Int. Cl.$^5$ .............................................. H01J 1/16
[52] U.S. Cl. ..................................... 313/344; 313/341; 313/343; 313/345
[58] Field of Search .............. 313/341, 344, 345, 343, 313/346 R, 346 DC

[56] References Cited

U.S. PATENT DOCUMENTS

| | | | |
|---|---|---|---|
| 2,306,925 | 12/1942 | Aicher | 313/344 |
| 2,329,118 | 9/1943 | Inman | 313/344 |
| 2,394,474 | 2/1946 | Peters | 313/344 |
| 2,424,518 | 7/1947 | Stuart | 313/344 |
| 2,820,920 | 1/1958 | Penon | 313/344 |
| 3,531,678 | 9/1970 | Schiavone | 313/345 X |
| 3,737,714 | 6/1973 | Theodosopoulos et al. | 313/344 |
| 3,767,959 | 10/1973 | George et al. | 313/344 |
| 3,812,393 | 5/1974 | Koo et al. | 313/344 |
| 4,316,116 | 2/1982 | Graves et al. | 313/344 |
| 4,355,259 | 10/1982 | Weiss | 313/344 |
| 4,661,739 | 4/1987 | Dvorak et al. | 313/341 |

Primary Examiner—Leo H. Boudreau
Assistant Examiner—Michael Razavi
Attorney, Agent, or Firm—John C. Fox

[57] ABSTRACT

A composite vacuum evaporation coil including a base coil and an overwind coil is characterized by the overwind coil being independent of the power source and being confined to the area of the turns of the base coil. Such a composite coil has improved efficiency and operating life.

8 Claims, 1 Drawing Sheet

COMPOSITE VACUUM EVAPORATION COIL

This is a continuation application Ser. No. 932,256, filed Nov. 19, 1986, now abandoned.

BACKGROUND OF THE INVENTION

This invention relates to a vacuum evaporation coil, and more particularly relates to a composite vaccum evaporation coil of a single wire base coil with a short overwind coil.

Vaccum evaporation is a widely practiced method of producing thin metal layers. For example, aluminum reflective layers are often produced on the inside surface of lamp and cathode ray tube envelopes by flash evaporating a slug of solid aluminum inside the envelope while in a vacuum environment. The slug is generally in the shape of a crimped ribbon or cylinder, and is inserted into the windings of a heater coil, which windings hold the slug in place. Evaporation is carried out by first heating the slug until the slug material melts and clings to the turns of the coil, and then further heating the molten slug material to cause rapid (flash) evaporation. The vapor then forms a uniform deposit on the cooler substrate, that is, the inner surface of the glass envelope of the lamp or the cathode ray tube.

The major performance criteria for such vacuum evaporation coils are its evaporating efficiency and its operating life. Evaporating efficiency of a coil is governed primarily by the evaporating surface area and by the ability to hold the molten slug material in place until evaporation can occur.

The operating life of a coil is generally governed by its ability to resist the corrosive attack of the evaporating material, and is thus somewhat dependent upon the surface area of the coil as well as its corrosion-resistant properties.

It is known that the addition of an overwind coil to a single wire base coil can dramatically increase both the efficiency and the operating life of the coil, by providing a large evaporating surface area separate from the base coil. Since most of the molten slug material is confined to the overwind coil, its material can be chosen for its wetting properties, while the base coil material can be chosen primarily for its resistive heating and corrosion resistant characteristics.

In the past, however, use of an overwind coil with a single wire base coil has resulted in a decreased electrical resistance of the composite coil, thereby requiring a higher electrical current to heat the slug sufficiently to cause its evaporation. Reducing the diameter of the base coil wire in order to compensate for this decreased electrical resistance results in decreased corrosion resistance, and thus has a deleterious effect upon the operating life of the coil.

Accordingly, it is an object of the invention to provide a composite vacuum evaporating coil in which a base coil is provided with an overwind coil in order to increase the evaporating efficiency and the operating life of the coil, without decreasing the electrical resistance of the coil, and without decreasing the diameter of the base coil wire.

SUMMARY OF THE INVENTION

In accordance with the invention, there is provided a composite vacuum evaporation coil comprising a base coil and an overwind coil, the base coil consisting of a single wire having a central portion with a plurality of coil turns, and two leg portions extending from the central portion, the overwind coil consisting of a wire having a smaller thickness than the base coil wire, with a plurality of turns surrounding the base coil wire, characterized in that the overwind coil is independent of the coil power source.

In accordance with a preferred embodiment of the invention, the location of the overwind coil is confined to the turns of the base coil and to a distance along the legs of the base coil which is less than the turn diameter of the base coil.

In accordance with another preferred embodiment of the invention, the pitch of the turns of the overwind coil is maintained within the range of from about 120 to 200 percent of the thickness of the overwind wire, and furthermore, the turn diameter of the overwind coil is maintained within the range of from about 101 to 120 percent of the thickness of the base wire.

In accordance with still another preferred embodiment, the base wire is provided with a coating of a corrosion-resistant material.

DESCRIPTION OF THE PREFERRED EMBODIMENTS

Figures 1, 2:
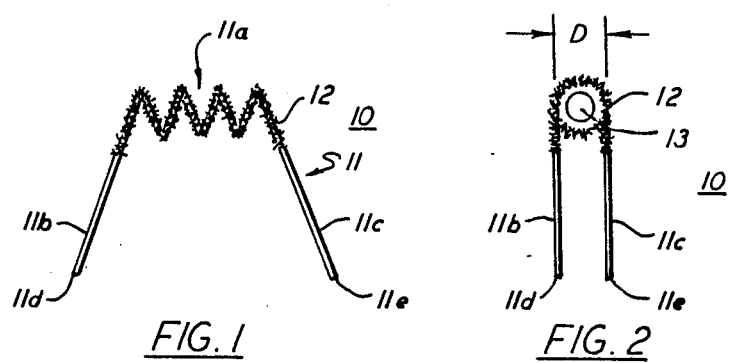
FIG. 1 is a front elevation view of a composite vacuum evaporation coil of the invention.
FIG. 2 is a side view of the vacuum evaporation coil of FIG. 1 showing the location of a slug of material to be evaporated.

Referring now to FIG. 1, there is shown in front elevation a composite vacuum evaporation coil 10 in accordance with the invention, in which base coil 11 has a central portion 11a, and legs 11b and 11c, with tip portions 11d and 11e. Central portion 11a and upper portion of legs 11b and 11c are overwound by overwind coil 12.

In FIG. 2, a side view of the coil of FIG. 1, there is shown a slug of material 13 to be evaporated, positioned within the turns of the base coil 11.

In operation, the coil and slug are located in a vacuum chamber, near a substrate to be treated, such as a glass envelope for a lamp. Electrical leads, not shown, are attached to the legs of the base coil near the tips 11d and 11e, the chamber atmosphere is evacuated, and electrical power is supplied to the coil in order to produce resistance heating of the slug 13. As the slug heats up, it first melts and wets the surface of overwind coil 12. With further heating, the molten mass adhering to the overwind coil evaporates into the evacuated atmosphere and deposits upon the substrate.

Since the function of the overwind coil is to retain the molten slug material in the primary area of heating, that is, the turns of the base coil, it is preferred to limit the location of the overwind coil to the vicinity of these base coil turns, sometimes including a small upper portion of the base coil legs. Most preferably, the overwind coil extends along the legs for a distance which is less than the diameter of the base coil turns.

Figure 3:
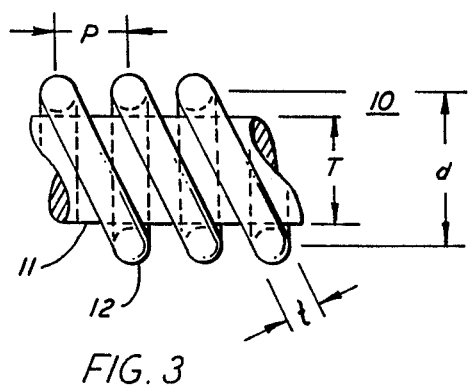
FIG. 3 is a stylized front view of a small section of the coil of FIGS. 1 and 2 showing dimensional relationships between the base coil and the overwind coil.

Referring now to FIG. 3, an enlarged view of a small overwound portion of the composite vacuum evaporation coil of FIGS. 1 and 2, there is shown the dimensional relationships between the base coil wire and the overwind coil. The first dimensional parameter is the pitch P of the overwind coil turns, which is simply the distance between adjacent turns. This pitch P may be expressed as a percent of the thickness t of the overwind wire and may range from about 120 to 200 percent of t, below which there is too little space between the turns to accommodate the material being evaporated and above which the turns tend to become entangled with each other during processing. Based on the above considerations, it is preferred to maintain the pitch P within the range of about 150 to 180 percent of the thickness t of the wire.

The second dimensional parameter is the turn diameter d of the overwound coil. d should in general be within the range of about 101 to 120 percent of the thickness T of the base wire, below which it becomes difficult to slip the overwind coil over the base coil, and above which heat cannot be effectively transferred from the base coil to the overwind coil. Based on the above considerations, it is preferred to maintain the turn diameter of the overwound coil within the range of about 105 to 110 percent of the base wire thickness.

Figure 4:
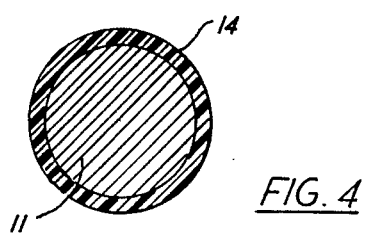
FIG. 4 is a section view of a base wire which has been overcoated with a corrosion-resistant material.

Referring now to FIG. 4, there is shown a cross-section of the base wire 11 having an overcoating 14 of a corrosion-resistant material such as boron nitride, boron carbide, or zirconium nitride. Such an overcoating can dramatically increase the operating life of the coil by making the base wire practically impervious to the corrosive action of the material to be evaporated.

The particular material chosen for the base coil should have sufficient electrical resistivity to achieve the desired heating of the material to be evaporated, as well as sufficient corrosion resistance to provide adequate operating life for the coil. Suitable base coil materials include tungsten and tantalum. The overwind coil material is chosen for its ability to be wetted by the material to be evaporated. Such overwind coil materials include tantalum, tungsten, and molybdenum. The wettability of the overwind coil material is an important consideration since it allows the slug of molten material to spread more or less evenly over the available surface area rather than to ball up and thereby make subsequent flash evaporation difficult to achieve.

Typical examples of composite vacuum evaporation coils in accordance with the invention include a tungsten base coil having a wire thickness of 0.035 inches, 4.5 turns having a turn diameter of 0.229 inches, and an overwind coil of 0.008 inch tungsten wire having a turn pitch of 189 percent, and a turn diameter of 0.037 inches. Such a composite coil exhibits a four fold increase in operating life over a similar base coil without an overwind coil when operated under the same conditions.

If the 0.008 inch overwind wire is replaced by a 0.010 inch wire having a turn pitch of 151 percent, and the same turn diameter, the life is increased seven fold over the base coil without an overwind.

What is claimed:

1. A composite vacuum evaporation coil comprising a base coil and an overwind coil, the base coil consisting of a single wire having a central portion with a plurality of coil turns, and two leg portions extending from the central portion, the overwind coil consisting of a wire having a smaller thickness than the base coil wire, with a plurality of turns surrounding the base coil wire, characterized in that both the base coil and the overwind coil are of circular cross-section, and in that the location of the overwind coil is confined substantially to the turns of the base coil and an upper portion of the legs of the base coil.

2. The composite vacuum evaporation coil of claim 1 in which the overwind coil extends along the upper portion of the legs for a distance less than the turn diameter of the base coil.

3. The composite vacuum evaporation coil of claim 2 in which the turns of the overwind coil have a pitch within the range of from about 120 to 200 percent of the thickness of the overwind wire.

4. The composite vacuum evaporation coil of claim 3 in which the pitch of the turns of the overwind coil is within the range of from about 150 to 180 percent of the thickness of the overwind wire.

5. The composite vacuum evaporation coil of claim 4 in which the turn diameter of the overwind coil is from 101 to 120 percent of the thickness of the base coil wire.

6. The composite vacuum evaporation coil of claim 5 in which the turn diameter of the overwind coil is from about 105 to 110 percent of the thickness of the base wire.

7. The composite vacuum evaporation coil of claim 1 in which the base coil wire is coated with a corrosion-resistant material.

8. The composite vacuum evaporation coil of claim 7 in which the corrosion-resistant material is selected from the group consisting of boron nitride, boron carbide, and zirconium nitride.

* * * * *